(12) United States Patent
Schaffer

(10) Patent No.: US 7,453,146 B2
(45) Date of Patent: Nov. 18, 2008

(54) HIGH POWER MCM PACKAGE WITH IMPROVED PLANARITY AND HEAT DISSIPATION

(75) Inventor: Christopher P. Schaffer, Long Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 369 days.

(21) Appl. No.: 11/141,861

(22) Filed: Jun. 1, 2005

(65) Prior Publication Data

US 2005/0275112 A1   Dec. 15, 2005

Related U.S. Application Data

(63) Continuation-in-part of application No. 10/620,029, filed on Jul. 14, 2003, now Pat. No. 6,946,740.

(60) Provisional application No. 60/583,104, filed on Jun. 25, 2004, provisional application No. 60/576,766, filed on Jun. 3, 2004.

(51) Int. Cl.
 *H01L 23/34* (2006.01)
(52) U.S. Cl. .............. 257/723; 257/724; 257/E25.011
(58) Field of Classification Search .......... 257/723, 257/724, 787, E25.011
 See application file for complete search history.

(56) References Cited

U.S. PATENT DOCUMENTS 6,545,364 B2   4/2003   Sakamoto et al.

OTHER PUBLICATIONS

International Search Report issued Sep. 21, 2006.

*Primary Examiner*—Hoai v Pham
(74) *Attorney, Agent, or Firm*—Ostrolenk, Faber, Gerb & Soffen, LLP

(57) ABSTRACT

A structure and a manufacturing method providing improved coplanarity accommodation and heat dissipation in a multi-chip module. One of the components in a multi-chip module (MCM) is provided with a recess formed in its respective top surface; and a film is applied so as to cover the top surfaces of the components and so that any excess film can enter into the recess. The recess is preferably a peripheral groove. Then when molding material is injected, it may surround and seal the side surfaces of the components, while not substantially covering the top surfaces that are covered by the film. Since the recess receives any excess film material that may be present, it may prevent such excess film material from covering the respective side surfaces of the corresponding component and creating a void between the component and the molding material. This advantageous effect of the invention is particularly useful when the top component surface in which the recess is formed is higher above the circuit substrate than the respective top surface of another one of the components.

10 Claims, 4 Drawing Sheets

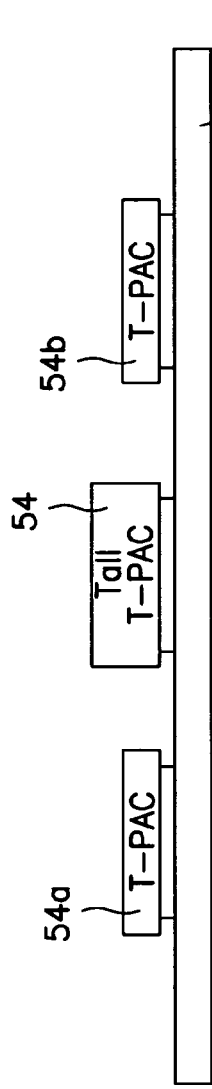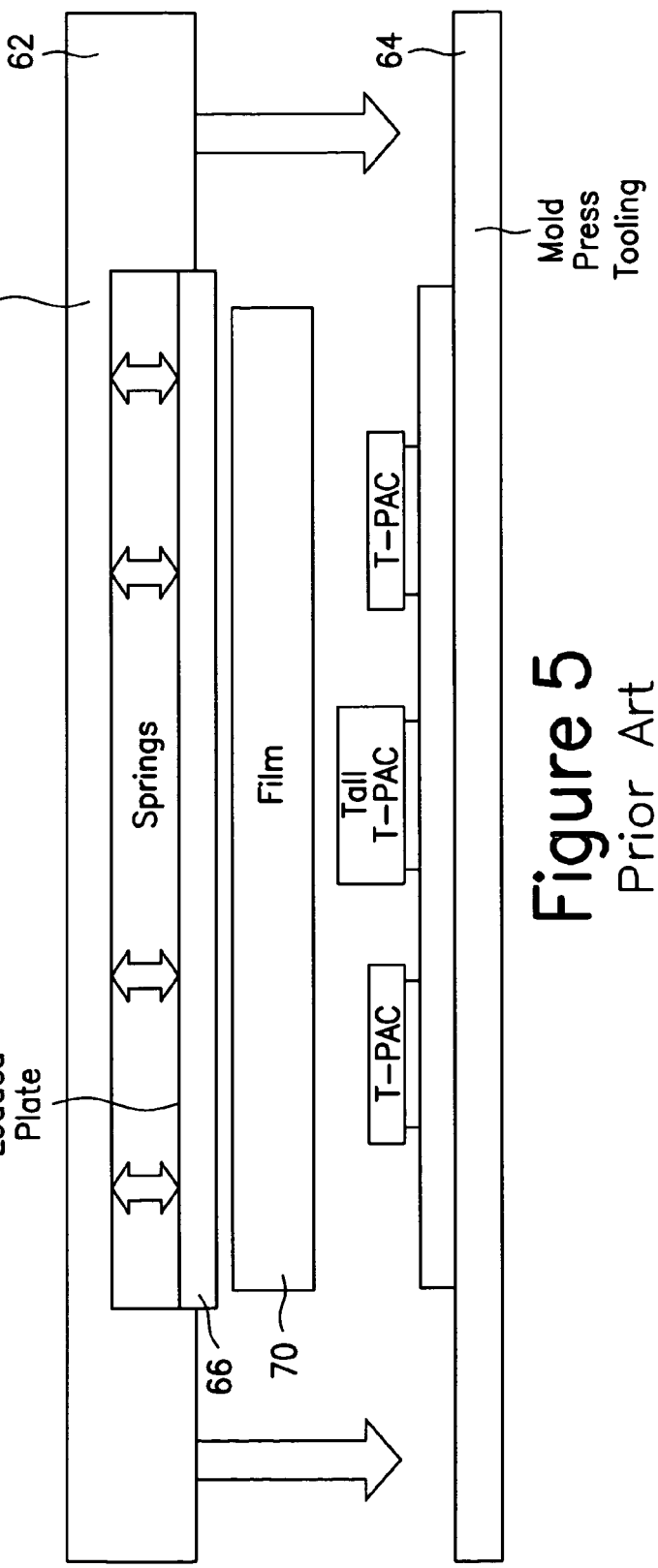

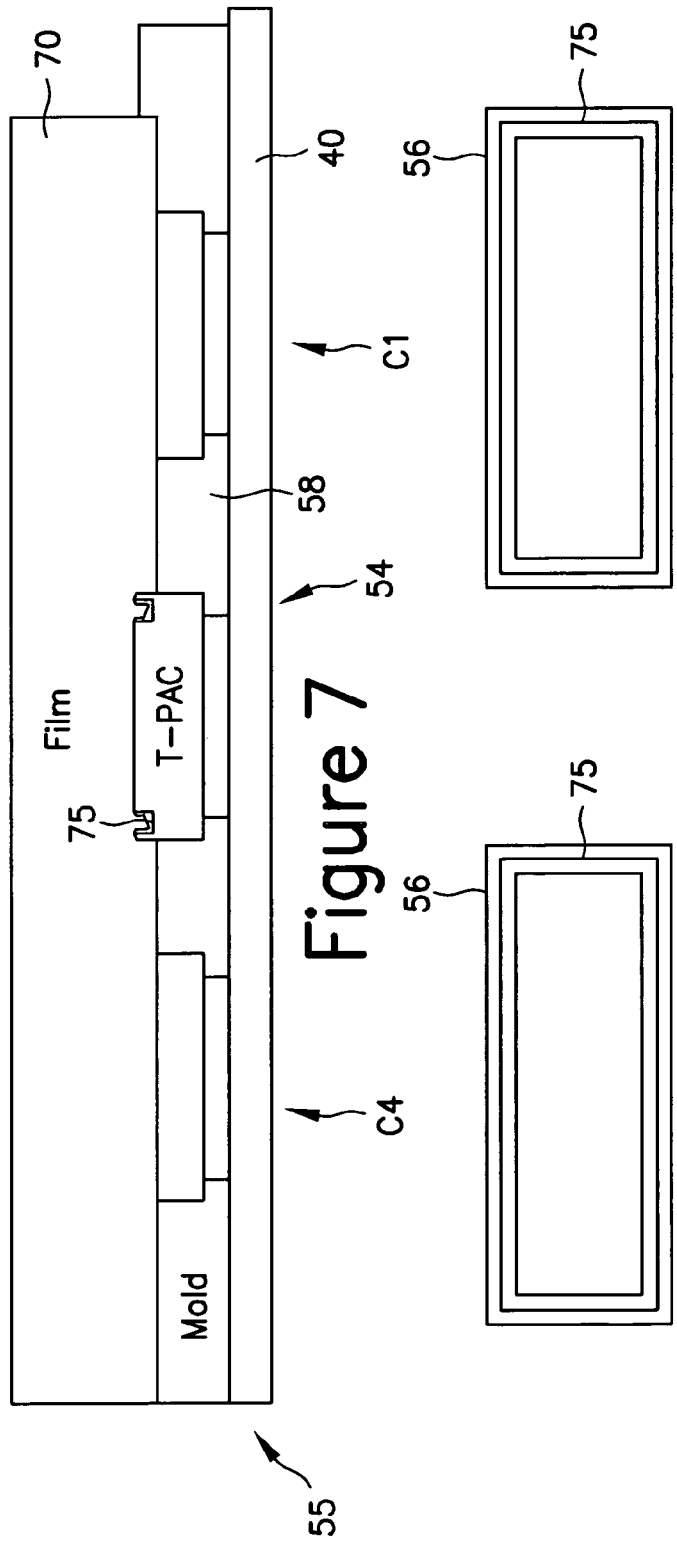

HIGH POWER MCM PACKAGE WITH IMPROVED PLANARITY AND HEAT DISSIPATION

CROSS-REFERENCE TO RELATED APPLICATIONS

This is a continuation-in-part of U.S. Ser. No. 10/620,029 filed Jul. 14, 2003, now U.S. Pat. No. 6,946,740. It is based upon and claims priority of U.S. Ser. No. 60/576,766 filed Jun. 3, 2004 and Ser. No. 60/583,104 filed Jun. 25, 2004. The disclosures of the foregoing applications are incorporated by reference.

BACKGROUND OF THE INVENTION

1. Field of the Invention

The present invention relates to multi-chip modules and more particularly to a structure providing improved coplanarity accommodation and heat dissipation in a multi-chip module.

2. Background Art

Ser. No. 10/620,029 and Ser. No. 60/576,766 disclose several embodiments of a multi-chip module (MCM), including a conductive element which serves as an electrical connector for electrically connecting respective electrical contacts on at least two power semiconductor devices. In addition to serving as an input or output connector, the conductive element improves heat transfer from the power semiconductor devices through the top of the module. This type of MCM is referred to commercially as a T-PAC™ module by its manufacturer, the International Rectifier Corporation.

One of those embodiments is the T-PAC module 54 shown in FIG. 1. A conductive element 56 bridges over and electrically connects respective contacts on a conventional MOSFET 30 and a flip-chip MOSFET 42 with its web portion 60. The conductive element 56 may be made of copper or another heat-conductive metal such as Au, Ag, Sn, Ti, brass, Ni or Al. A connector 64 connects the web portion 60 to a printed circuit board 40. The connector 64 may optionally be disposed between the two MOSFETS 30, 42 rather than in the position shown.

In more detail, a top surface of the web portion 60 of the conductive element 56 is exposed to the exterior of the T-PAC module 54, which improves heat dissipation from the MOSFETs 30, 42 through the top of the module. The above components are placed in a mold and resin is injected, forming a molded housing 58, disposed around and between the conductive element 56, its connector 64, the conventional MOSFET 30, and the flip-chip MOSFET 42. The resin is not, however, molded over the top of the conductive element 56.

A typical layout of an MCM (multi-chip module) 55 is shown in plan view in FIG. 2. In this example, the MCM 55 contains only the one T-PAC module 54. As shown, additional components C1, C2, C3 and C4 may be disposed on the circuit board along with the T-PAC module 54 and within the molding 58. Additional layouts are shown in Ser. No. 60/576,766.

A problem in this technology is that the components within an MCM module, which may include one or more T-PAC module(s), may differ in height. The presence of a tall T-PAC module in the mold may cause resin to flow in the mold over the top of a shorter T-PAC module, which is undesirable since the tops of the T-PAC modules should remain exposed.

FIG. 3 is a schematic cross-sectional view of the MCM 55 in FIG. 2 as seen during an intermediate manufacturing step. A T-PAC module 54 containing components such as switching components, passive components or MOSFETs as seen for example in FIG. 1 is disposed at the center of the printed circuit board 40, while other components C1 and C4 are disposed on other portions of the printed circuit board 40.

A lead frame or another type of substrate may be substituted for the printed circuit board 40.

Before forming the molding 58, a compliant plastic film 70 is applied over the tops of the module 54, the component C1 and the component C4, thus sealing off the tops of the components while compensating for the height differences between the respective components. The film 70 prevents mold compound from flowing over the top of any component. The film may be any high temperature plastic film, such as Kapton. The resin molding material 58 is applied thereafter, after which the film 70 is removed.

FIGS. 4, 5 and 6 show the molding process. In this example, three T-PAC modules 54, 54a, 54b are disposed on the board 40. The film 70 is pressed onto the assembly of the modules and the board by tools 62, 64, and more particularly by a spring-loaded plate 66 on the tool 62, while the plastic molding compound is injected around the modules.

This molding arrangement successfully prevents mold compound from flowing over the tops of the components. However, it has been found that if the top surface of the conductive element 56 of a T-PAC 54 is excessively high above the printed circuit board 40, excess film material may spill over and form protrusions 57 at the sides of the conductive element, as shown in FIG. 3. Then, when the molding material 58 is added, these protrusions may prevent the resin material from reaching the conductive element, forming a void between the material and the conductive element which reduces the structural integrity and strength of the MCM and its resistance to environmental hazards.

SUMMARY OF THE INVENTION

To address the foregoing problem, a groove or "moat" may be formed in the top surface of the conductive element in a T-PAC module. When the film is applied, if there is any excess film material, for example due to the height of the conductive element, the excess material will be taken up by the groove so that it will not spill over the sides of the conductive element and interfere with the subsequent application of the resin mold.

According to one aspect of the invention, a semiconductor module may comprise a circuit substrate; a semiconductor device and an additional component, each having respective upper and lower electrodes, the lower electrodes being disposed in electrical contact with the circuit substrate; a conductive element being electrically connected to the circuit substrate and having a web portion that bridges over and contacts the respective upper electrodes of both said semiconductor device and the additional component; the web portion having an upward-facing web surface, and a recess being formed in the web surface. The recess advantageously comprises a groove formed in a peripheral region of the web surface.

According to another aspect of the invention, a multi-chip module may have a circuit substrate; a semiconductor module disposed on the circuit substrate; another component disposed on the circuit substrate; and molded material surrounding and sealing both the semiconductor module and the other component. The other component may be a semiconductor device, a passive component, or another semiconductor module, for example.

The invention is particularly advantageous when the upward-facing web surface of the semiconductor module is higher above the circuit substrate than a top surface of the other component, in which case the recess or groove receives any excess film material that may be present in the manufacturing method described herein.

In a manufacturing method according to another aspect of the invention, a multi-chip module (MCM) may be made by disposing a plurality of components on a circuit substrate, each component having an upward-facing top surface; one of the components having a recess formed in its respective top surface; and applying a film so as to cover the top surfaces of the components and to enter into the recess. The recess is preferably formed as a groove in a peripheral region of the top surface. Then molding material may be injected so as to surround and seal side surfaces of the components, while not substantially covering the top surfaces thereof that are covered by the film. The recess may receive any excess film material that may be present, so as to prevent such excess film material from covering the respective side surfaces of the corresponding component and creating a void between the component and the molding material. This advantageous effect of the invention is particularly useful when the top component surface in which the recess is formed is higher above the circuit substrate than the respective top surface of another one of the components.

Other features and advantages of the present invention will become apparent from the following description of an embodiment of the invention which refers to the accompanying drawings.

BRIEF DESCRIPTION OF THE DRAWINGS

FIGS. 4, 5 and 6 show steps in a process of manufacturing the MCM of FIGS. 2 and 3;
FIG. 7 is a cross-sectional view of an intermediate product that is formed during the process of manufacturing an MCM according to an embodiment of the invention,
FIG. 8 being a plan view thereof;
and
FIG. 9 is a schematic side view of a final product corresponding to the intermediate product disclosed in FIG. 7,
FIG. 10 being a plan view thereof.

DETAILED DESCRIPTION OF EMBODIMENTS OF THE INVENTION

Figure 1:
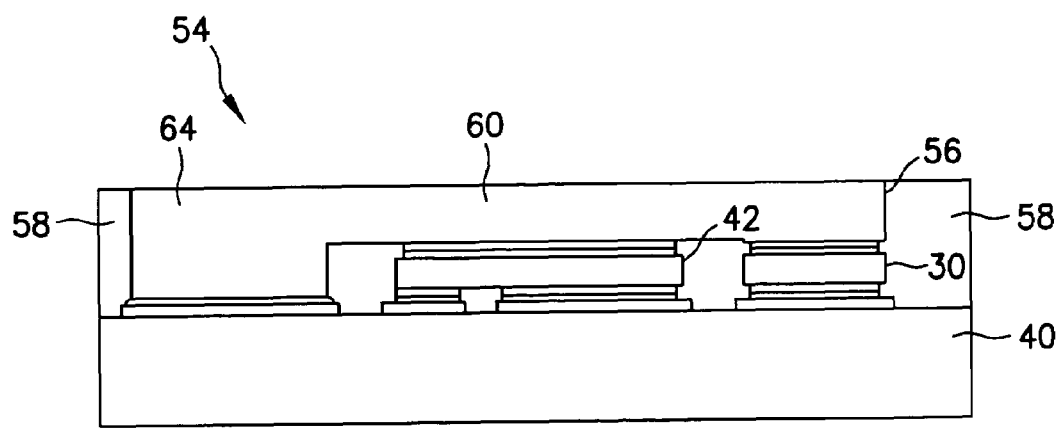
FIG. 1 is a side view of a prior art T-PAC module.
Figure 2:
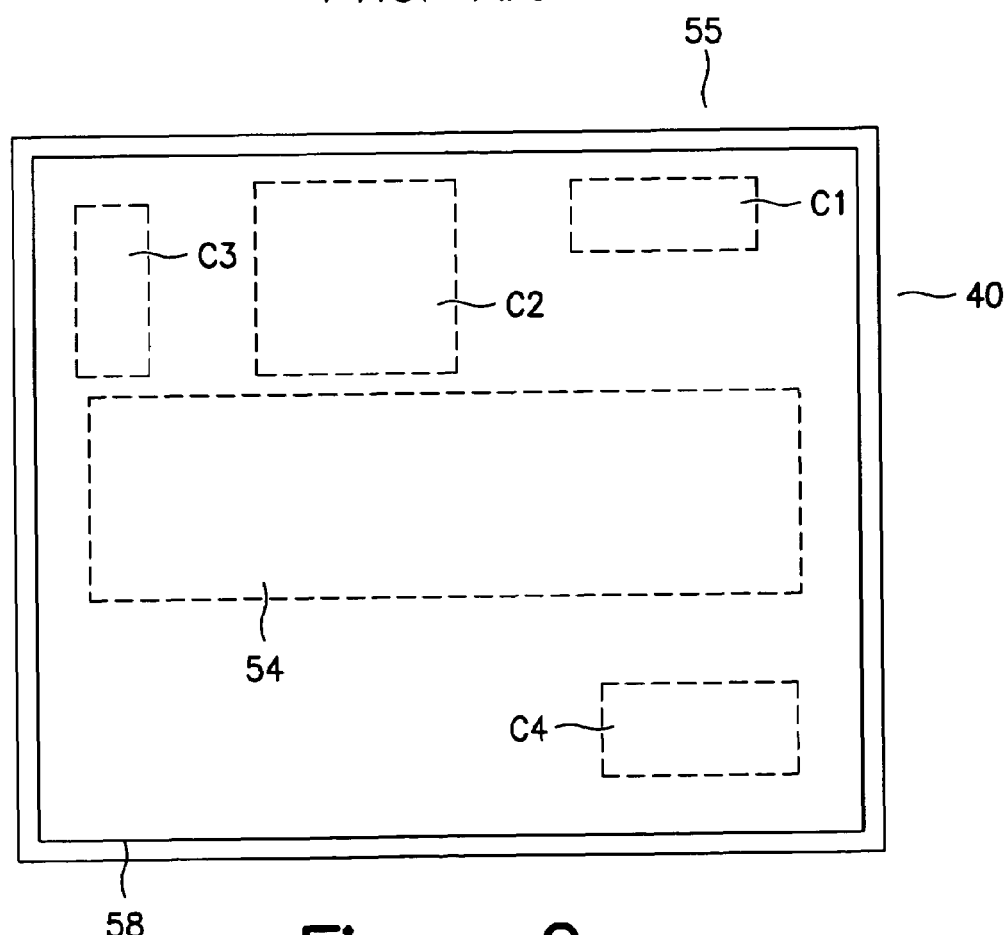
FIG. 2 is a plan view of a prior art multi-chip module (MCM)
Figure 3:
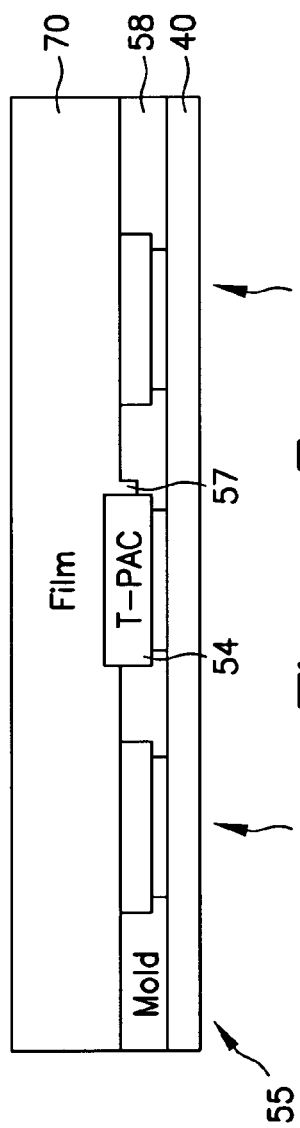
FIG. 3 is a cross-section of the prior art MCM of FIG. 2.
Figure 6:
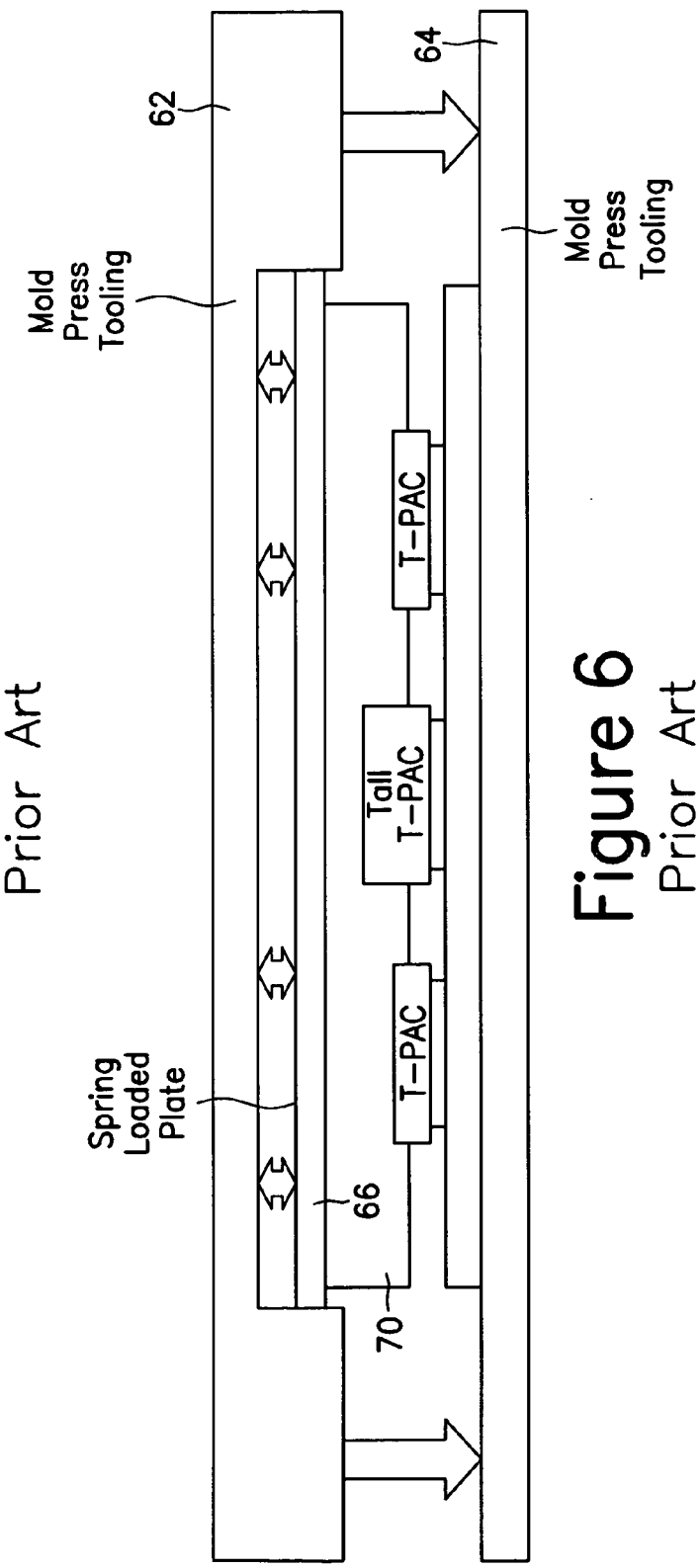

An improvement which avoids the problem of the prior art is shown in FIGS. 7-10. A groove 75 is formed in the top surface of the conductive element 56 of a T-PAC module 54. When the film 70 is applied to the tops of the components C4, 54, and Cl, any excess film material displaced by the excessive height of the conductive element 56, instead of being displaced to the sides of the conductive element, instead is accommodated within the groove 75. This prevents the protrusions from forming at the sides of the conductive element and allows the resin material 58 to reach all portions of the sides of the conductive element 56.

The final product is shown in FIG. 9, after removal of the film 70. Some of the film material may remain in the groove 75.

Although the present invention has been described in relation to particular embodiments thereof, many other variations and modifications and other uses will become apparent to those skilled in the art. Therefore, the present invention is not limited by the specific disclosure herein.

What is claimed is:

1. A semiconductor module comprising in combination:
a circuit substrate;
a first semiconductor device and a second semiconductor device, each having respective upper and lower electrodes, said lower electrodes being disposed in electrical contact with said circuit substrate;
a conductive element being electrically connected to said circuit substrate and having a web portion which bridges over and contacts the respective upper electrodes of both said semiconductor devices;
an additional component disposed on said circuit substrate and laterally spaced from said conductive element;
said web portion having an upward-facing web surface, said upward-facing web surface is higher above said circuit substrate than a top surface of said additional component and includes a groove formed therein.

2. The module of claim 1, wherein said groove is formed in a peripheral region of said web surface.

3. The module of claim 1, further comprising molded material surrounding and sealing said conductive element, said semiconductor device and said additional component.

4. The module of claim 3, wherein said upward-facing web surface is substantially free of said molded material.

5. The module of claim 1, wherein said additional component is a passive component.

6. The module of claim 1, wherein said groove formed in said web surface contains plastic film material.

7. A multi-chip module (MCM) comprising in combination:
a circuit substrate;
the semiconductor module of claim 1 disposed on said circuit substrate;
another component disposed on said circuit substrate;
molded material surrounding and sealing both said semiconductor module and said other component.

8. The MCM of claim 7, wherein said other component is a second semiconductor module according to claim 1.

9. The MCM of claim 7, wherein said other component is a power semiconductor device.

10. The MCM of claim 7, wherein said other component is a passive component.

* * * * *